United States Patent
Calvert et al.

(10) Patent No.: US 6,348,240 B1
(45) Date of Patent: Feb. 19, 2002

(54) METHODS FOR AND PRODUCTS OF MODIFICATION AND METALLIZATION OF OXIDIZABLE SURFACES, INCLUDING DIAMOND SURFACES, BY PLASMA OXIDATION

(75) Inventors: Jeffrey M. Calvert; Pehr E. Pehrsson, both of Alexandria, VA (US); Martin C. Peckerar, Silver Spring, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 07/933,147

(22) Filed: Aug. 21, 1992

Related U.S. Application Data

(63) Continuation-in-part of application No. 07/691,565, filed on Apr. 25, 1991, now abandoned.

(51) Int. Cl.[7] .............................. B05D 1/00; B05D 3/06; H05H 1/24
(52) U.S. Cl. ...................... 427/539; 427/113; 427/123; 427/304
(58) Field of Search ................................. 427/535, 536, 427/537, 538, 539, 515, 520, 512, 510, 488, 489, 491, 96, 98, 99, 113, 123, 124, 125, 250, 304, 305

(56) References Cited

U.S. PATENT DOCUMENTS 4,330,569 A  *  5/1982  Gulett et al. ................ 427/539

(List continued on next page.)

FOREIGN PATENT DOCUMENTS

| DE | 225548 | * | 7/1985 | ................ 427/539 |
| EP | 110258 | * | 6/1984 | ................ 427/539 |

OTHER PUBLICATIONS

JPO English Abstract to (JP59076052A) Pat #JP360221400A to Maeda et al, Nov. 6, 1985.*

(List continued on next page.)

Primary Examiner—Marianne Padgett
(74) Attorney, Agent, or Firm—John J. Karasek; Jane Barrow

(57) ABSTRACT

The present invention concerns a process for modifying oxidizable surfaces, including diamond surfaces, including methods for metallizing these surfaces, where these methods include oxidation of these surfaces. The present invention also relates to the products of these methods.

In this process, a surface is first plasma oxidized, usually under an RF $O_2$ plasma. Chemical functional groups are then attached to the surface. If the surface is to be metallized, the chemical functional groups are selected to be catalyzable, the surface is then catalyzed for electroless metallization, and the surface is finally treated with an electroless plating solution to metallize the surface.

If modified surface is to be patterned, the modified surface is exposed through a mask to pattern the surface after the attachment of the chemical functional groups.

2 Claims, 1 Drawing Sheet

U.S. PATENT DOCUMENTS

| | | | | |
|---|---|---|---|---|
| 4,344,981 A | * | 8/1982 | Imada et al. | 427/539 |
| 4,487,880 A | * | 12/1984 | Ueno et al. | 427/539 |
| 4,521,444 A | * | 6/1985 | Ponjee et al. | 427/539 |
| 4,535,029 A | * | 8/1985 | Intrater et al. | 427/113 |
| 4,925,701 A | * | 5/1990 | Jansen et al. | 427/535 |
| 4,957,591 A | * | 9/1990 | Sato et al. | 427/535 |
| 5,063,081 A | * | 11/1991 | Cozzette et al. | 427/2 |
| 5,077,085 A | | 12/1991 | Schnur et al. | 427/98 |
| 5,079,600 A | | 1/1992 | Schnur et al. | 357/4 |
| 5,137,784 A | * | 8/1992 | Suzuki et al. | 428/408 |
| 5,190,796 A | * | 3/1993 | Iacovangelo | 427/305 |
| 5,239,746 A | * | 8/1993 | Goldman | 427/97 |
| 5,250,327 A | * | 10/1993 | Ogata et al. | 427/126.1 |
| 5,270,080 A | * | 12/1993 | Mino et al. | 427/399 |

OTHER PUBLICATIONS

Calvert et al., Advanced Metallization and Processing for Semiconductor Devices and Circuits—II, "Selective Metallization of CVD Diamond Films", Symposium held on Apr. 27–May 1, 1992, pp. 905–910.

Calvert et al., "New Surface Imaging Techniques for Sub–0.5 Micrometer Optical Lithography", Solid State Tech., 34, 10 pp. 77–82, Oct. 1991.

Dulcey et al., "Deep UV Photochemistry of Chemisorbed Monolayers: Patterned Coplanar Molecular Assemblies", Science 252, pp. 551–554, Apr. 1991.

* cited by examiner

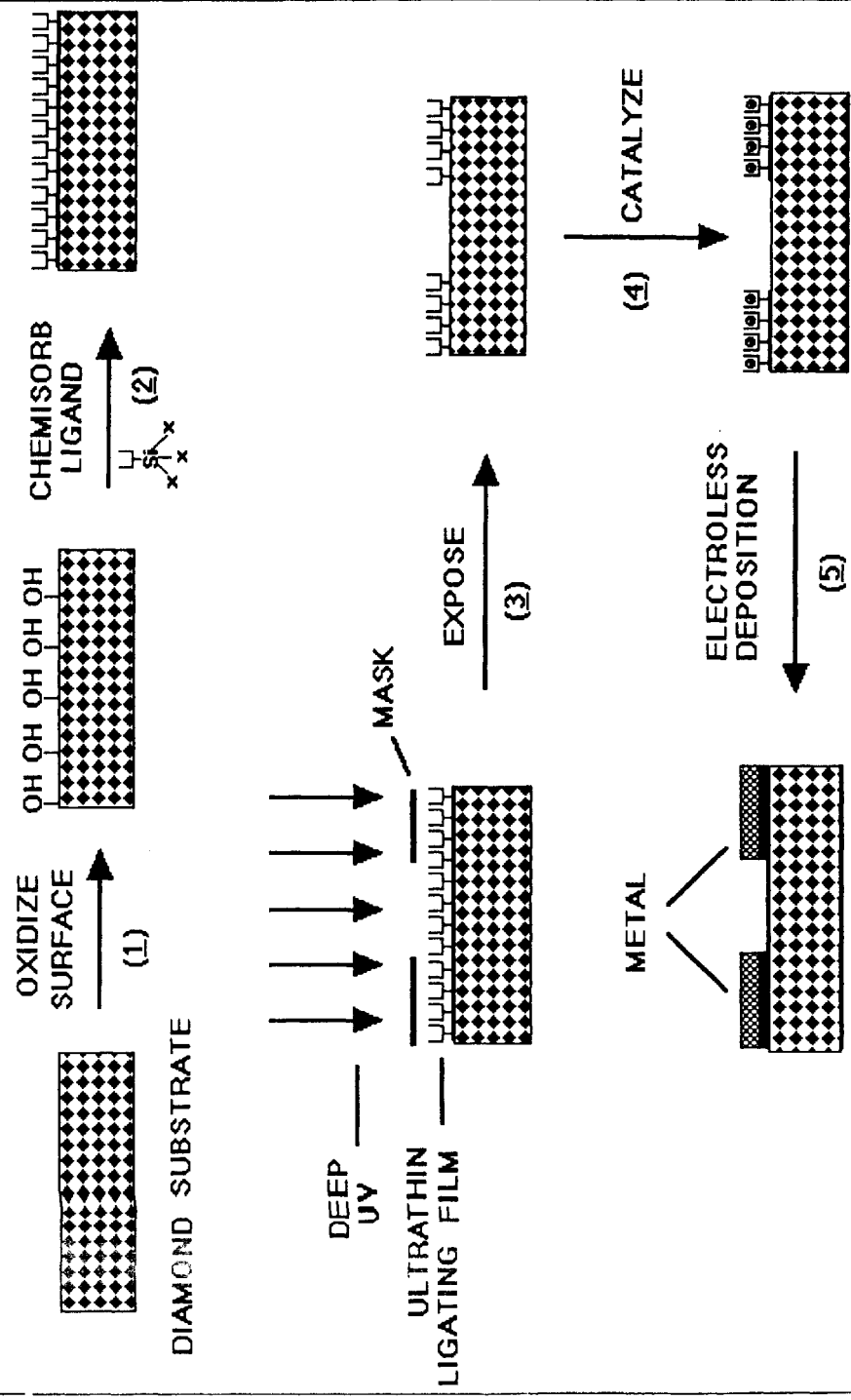

METHODS FOR AND PRODUCTS OF MODIFICATION AND METALLIZATION OF OXIDIZABLE SURFACES, INCLUDING DIAMOND SURFACES, BY PLASMA OXIDATION

CROSS REFERENCE TO RELATED APPLICATION

This is a continuation-in-part of prior application Ser. No. 07/691,565, filed Apr. 25, 1991 and now abandoned by Calvert et al., and incorporated by reference herein.

BACKGROUND OF THE INVENTION

1. Field of the Invention

The present invention relates to methods for modifying oxidizable surfaces, including diamond surfaces, including methods for metallizing these surfaces, where these methods include plasma oxidation of these surfaces. The present invention also relates to the products of these methods.

2. Description of the Related Art

Modified surfaces are increasingly of great technological importance. In particular, modified diamond surfaces have increasing technological importance because of the attractive physical properties of diamond, including hardness, broad wavelength transparency, high thermal conductivity and sound propagation velocity, variable electrical resistivity, low friction coefficient, high refractive index, and chemical and biological inertness. Applications for modified diamond surfaces exist or are foreseen in a number of areas, including microelectronics (semiconductive layers, optical and x-ray masks, and heat dissipators), optics (transparent or antireflective coatings), machine tools (abrasion resistant coatings), and biotechnology (biocompatible coatings for implants, biosensors).

Of particular interest is the deposition of adherent, conductive metal coatings (including metal contacts) onto these surfaces for microelectronic and mechanical applications. For instance, metal-coated dielectric, such as polymers and ceramics (including diamond) have increasing technological importance in a variety of applications. These applications include use in circuit boards, use for shielding, lithographic masks, etc.

Surfaces coated with various chemical functional groups also are of increasing technological importance. Chemical sensing, including biosensing, is just one area where surfaces coated with chemical functional groups may be employed. For instance, a surface is coated with a particular antigen may be used in testing for a particular antibody.

For many of these applications, it is desirable for these surfaces to be modified in a pattern. The terms "pattern" and "patterning" have meanings that vary from application to application. However, for each area of application, these terms are well-understood by skilled practitioners in the art. For example, in the context of fabricating circuit boards, patterned metallization means laying down conductive pathways on a circuit board, preferably with through-holes and other useful structures. In the context of microelectronic applications, patterned metallization means laying down conductive pathways with linewidths in the sub-0.5 $\mu$m range, consistent with VLSI applications. Preferably, in the context of microelectronics, these linewidths are about 0.1 $\mu$m, using currently available lithographic techniques. As x-ray lithographic techniques improve, it is anticipated that the present invention will produce microelectronic circuits with linewiths of about 0.05 $\mu$m. In the context of lithography, patterning means creating a pattern of lines on a mask with sufficient resolution and packing density for the particular application at hand. In the context of chemical applications (such as chemical sensing) patterned chemical modification means attaching chemical groups in a pattern consistent with the specific application and system at hand.

A problem associated with patterned metallization is that it is typically accomplished by means of a "lift-off" process, in which metal is evaporated or sputtered over a lithographically defined photoresist, and then dissolution of the remaining resist removes metal from selected regions of the metallized surface. This process, which is subtractive in nature, wastes metal and is more difficult and expensive than a process in which metal is deposited in an additive fashion, i.e. only in regions where it is required.

Various workers have fabricated contacts and metal patterns on diamond using sputter deposition or evaporation of Ag, Cu and Au, Al, W and numerous alloys. The principal problems with forming diamond/metal interfaces fabricated with conventional methods are obtaining reproducible and controllable electrical characteristics and obtaining satisfactory adhesion of the metal to the diamond surface.

Acceptable adhesion of metal to diamond and good ohmic contact can be obtained if the metallized substrate is annealed at high temperature (800–900° C.), forming a metal carbide layer at the interface. However, such high temperature is also problematic for metal/diamond contact formation because the diamond surface is subject to graphitization, which can degrade the electrical properties of the interface. Vacuum metallization is another available method for metallizing diamond surfaces, but this method requires complex, expensive equipment.

A problem with forming polymer/metal interfaces is that currently employed techniques for surface modification result in a surface that is roughened on the microns scale. For many applications, especially microwave and millimeter wave applications, a much smoother surface is desired.

The principal problem encountered in modifying diamond and other surfaces, both for metallization and other types of functionalization, is putting a sufficient density of functional groups on the diamond surface to carry out a chemisorption reaction. As is shown below in the summary of the invention, plasma oxidation processes are useful for this purpose. Other processes may also be useful. Diamond surfaces may be modified by detergents and acids, which produce oxygen-containing functionalities on the diamond surface. However, these processes may not result in a sufficient concentration of the type of oxygen-containing functional groups needed to carry out a commercially viable chemisorption reaction. Only oxidation processes that result in high concentrations of oxygen-containing functional groups that participate in chemisorption reactions are useful for modifying oxidizable surfaces.

Adhesive metal patterns can be deposited selectively on a wide variety of surfaces using ultrathin film (UTF)-based metallization processes. See co-pending application Ser. No. 07/691,565; see also Schnur et al., U.S. Pat. No. 5,077,085, issued Dec. 31, 1991; Schnur et al., U.S. Pat. No. 5,079,600, issued Jan. 7, 1992; Calvert et al., *New Surface Imaging Techniques for Sub-0.5 Micrometer Optical Lithography,* Solid State Technology 34, 77 (October 1991); Dressick et al., *Selective Electroless Metallization of Patterned Ligand Surfaces,* Proc. Materials Research Soc'y 1992 Spring Meeting Symposium C: Advanced Metallization & Processing for Semiconductor Devices (in press); Calvert et al., *Top Surface Imaging Using Selective Electroless Metallization* of *Patterned Monolayer Films,* ACS Symposium Series on Polymers for Microelectronics (invited paper), which are incorporated by reference herein.

These references describe methods and materials for the attachment (by chemisorption) of ultrathin film (UTF) precursor materials (such as organosilanes or organotitanates) to surfaces that either intrinsically possess, or are treated to have, highly reactive polar surface groups. The references also teach patterning the chemisorbed UTF layers with actinic radiation, catalyzing the patterned UTF layers by exposure to either a Pd/Sn colloidal catalyst or a tin-free Pd catalyst, then selectively metallizing by immersion in an electroless plating bath. Omission of the irradiation step leads to a homogeneously metallized, rather than a patterned, surface.

Many surfaces, however, do not intrinsically possess a suitable density of reactive surface groups to carry out a commercially viable chemisorption reaction to attach UTFs. These surfaces include diamond and polymers such as polyethylene (PE) and polyethersulfone (PES). Direct treatment of these substrates with UTF precursors does not lead to a useful degree of surface functionalization. To modify or metallize these surfaces, a different approach is needed.

These surfaces can be rendered amenable to chemisorption reactions by carefully chosen surface oxidation pretreatment. Many methods for oxidizing surfaces are known, some of which include treatment with $KMnO_4$, chromic acid, molecular or atomic oxygen, ozone, peroxide, persulfate, perchlorate, etc. The nature, distribution, and density of oxidized surface functional groups depends greatly on the type of oxidant, the substrate, and the particular treatment conditions. Thus, although a variety of oxidation pretreatments are available, few are actually useful for practical applications due to factors such as reagent toxicity, environmental unsuitability, need for expensive capital equipment, undesired side reactions, unsuitable reaction conditions (high temperature, long treatment times), or inability to produce the specific type and density of oxidized surface functional groups required for UTF chemisorption. In the co-pending application, the PE and PES surfaces were oxidized in a hot acidic potassium dichromate solution for 90 minutes to obtain surface functionalization with ligating UTFs and subsequent electroless metallization. This approach is not particularly desirable because of the use of highly corrosive, toxic and environmentally problematic chemicals, as well as long treatment times.

Relatively little is known about the effects of varying oxidation conditions on diamond surfaces. Known methods for oxidizing diamond include heating in $O_2$ and O, and treatment with detergents and acids. For several reasons, these processes are undesirable as oxidative pretreatments for UTF surface functionalization. Oxidation in $O_2$ at elevated temperatures is highly complex and, depending on conditions, may be slow and may lead to graphitization, faceting and etching. The diamond surface oxygen-containing groups generated by exposure to $O_2$ or O are thought to be primarily bridging etheric and carbonyl oxygen groups. These surface groups are not readily amenable to chemisorption. The nature and distribution of oxidized surface functionalities formed by oxidation in detergents and acids are not known.

Because of the uncertainty associated with the nature of the untreated diamond surface, it was necessary to develop procedures for diamond oxidation that would lead to sufficient functionalization for the selective metallization process to occur. A practical, reproducible method is needed for oxidizing surfaces as a pretreatment for carrying out a chemisorption reaction, where this oxidation method forms significant densities of groups that are readily amenable to chemisorption.

Another problem is encountered in modifying many polymer substrates: swelling, blistering and dissolution of the polymer substrate when the chemisorption reaction is carried out in organic solution. Therefore, it is desirable to carry out the chemisorption reactions in substantially aqueous solutions (i.e. solutions without sufficient quantities organic solvents to cause these deleterious effects). Aqueous solutions have the additional advantages of being more economical, environmentally friendlier, and safer than many organic solutions.

SUMMARY OF THE INVENTION

Accordingly, it is an object of this invention to oxidize surfaces, including diamond surfaces, to put a sufficient type and density of oxygen-containing functional groups on the surface to perform commercially viable chemisorption reactions.

It is a further object of this invention to perform chemisorption reactions on these surfaces, thereby attaching a homogeneous layer of chemical functional groups to these surfaces, where these layers optionally form patterns.

It is a further object of this invention to perform these chemisorption reactions in substantially aqueous solutions.

It is a further object of this invention to deposit on these surfaces, adherent, conductive metal coatings with reproducible and controllable characteristics, at temperatures well below annealing temperatures, without roughening these surfaces by an amount that will significantly affect the transmission of microwaves or millimeter waves, and to deposit these metal coatings additively, and without the use of highly toxic reagents such as chromic acid, and where these metal coatings optionally form patterns.

These and other objects of the invention are accomplished by the structures and processes hereinafter described.

The method of the present invention comprises oxidizing a surface in an oxygen-containing plasma, and attaching to the oxidized surface chemical functional groups capable of bonding to the oxidized surface by performing a chemisorption reaction between the oxidized surface and the chemical functional groups. The method of the present invention may optionally include the additional step of metallizing the functionalized surface by immersion in an electroless plating bath. The method of the present invention may optionally include the additional step of photolithographically patterning the functionalized surface with actinic radiation. If the surface is metallized, any photolithographic patterning step is carried out prior to electroless metallization. The process of the invention for selectively metallizing diamond films is described in Calvert et al., *Selective Metallization of CVD Diamond Film,* Proc. Materials Research Soc'y 1992 Spring Meeting, Symposium C: Advanced Metallization & Processing for Semiconductor Devices (in press), which is incorporated by reference herein.

The product of this method is a modified surface, which optionally may be selectively patterned. This surface may be a diamond surface or some other oxidizable surface. If the surface is diamond, it may be free-standing or disposed on a substrate. The modified surface may be metallized or chemically functionalized. The selectively patterned metallized surface may form a printed circuit board, and may include through-holes and other useful structures.

The functional groups referred to in this application are only those functional groups that react with surface oxygen groups in a chemisorption reaction. Furthermore, in the context of metallization, the functional groups referred to in this application are only those functional groups which are catalyzable for electroless metallization.

BRIEF DESCRIPTION OF THE DRAWING

A more complete appreciation of the invention will be readily obtained by reference to the following Description of the Preferred Embodiments and the accompanying drawing, wherein:

FIG. 1 illustrates the process steps for selectively depositing a metal film on diamond.

DETAILED DESCRIPTION OF THE PREFERRED EMBODIMENTS

In a preferred embodiment of the invention, as shown in step (1) of FIG. 1, the surface is oxidized in an RF oxygen plasma, thereby modifying the surface to include oxygen-containing functional groups. Other oxygen-containing plasmas, such as air plasmas, are also effective, but are less preferred than RF oxygen plasmas, due to the potential incorporation of non-oxygen-containing species. The oxidation conditions preferably should fall within the range from about 10 seconds to about 20 minutes and from about 25 watts to about 200 watts. Consistently good results are observed throughout this range of oxidation conditions. Most preferably, a minimum oxidation time is used to optimize the cycle time.

The plasma oxidation treatment provides an effective method for oxidizing the diamond surface. This treatment provides a sufficient density of the necessary oxygen-containing surface groups, which are believed to be primarily hydroxyl (—OH) or hydroxyl-containing functional groups, amenable to further chemisorption reactions.

In the case where the surface is to be metallized, it is preferred to functionalize the oxidized surface with catalyzable functional groups (i.e. catalyzable ligands), as shown in step (2) of FIG. 1, and to additionally catalyze the functionalized surface with any of the known metallization catalysts used for electroless metallization, as shown in step (4) of FIG. 1.

Preferably, the catalyzable chemical functional groups are attached to the oxidized surface by chemisorbing catalyzable functional groups onto the oxidized diamond surface. The term "chemisorbed functional group" refers to a structure, typically an organosilane, with a polar surface group which binds to the oxidized surface, and a terminal group which imparts the desired functionality to the surface. In metallization applications, this terminal group binds to a metallization catalyst, unless treated with actinic radiation. See U.S. Pat. No. 5,079,600. Chemisorption provides a means for conferring a wide range of functional characteristics (such as chemical reactivity, photosensitivity, surface free energy, density and spacing of surface functional groups, etc.) to the surface. Persons skilled in the art can readily select from a wide variety of chemisorbed functional groups to impart desirable functional characteristics. A selection of these groups may be found in Silicon Compounds Register and Review, (Huls America), incorporated by reference herein. Most preferably, the chemical functional groups contain one or more amine terminal groups. Amine groups may be monoamines, diamines or triamines. Most preferably, the terminal groups are unreactive with either the oxidized surface or the surface groups that bind to the oxidized surface.

Organosilane chemical functional groups may be monofunctional, difunctional or trifunctional silane groups. Preferred chemical functional groups contain polar heads with one or more methoxy groups or one or more chloride groups. Step (2) in FIG. 1 illustrates chemisorption of a trifunctional silane.

In the case where the surface is to be photolithographically patterned, the reactivity of the functionalized surface is selectively modified by irradiating the functionalized surface with actinic radiation through a photolithographic mask. This actinic radiation, which is defined as radiation which effects chemical changes in the chemical functional groups, includes UV light, x-rays, electron beams and ion beams. Preferably, this actinic radiation is deep UV light, as shown in step (3) of FIG. 1. As with plasma oxidation, it is preferred to minimize the exposure time to optimize cycle time. UV lasers, especially ArF excimer lasers are preferred for exposing the functionalized surface, due to the fast exposure times they achieve. Exposure to deep UV light modifies the reactivity of the terminal groups. In particular, upon exposure, catalyzable terminal groups lose their ability to bind to metallization catalysts. Consequently, only unexposed portions of the functionalized surface will be metallized upon immersion in the electroless plating bath.

In a preferred embodiment of the invention, the catalyst is a palladium catalyst. More preferably, the catalyst is essentially tin-free. Most preferably, the catalyst is selected from the group $PdCl_4^{2-}$ salts, bis-(benzonitrile)palladium dichloride and palladium dichloride. Skilled practitioners in the art will recognize that a large variety of complexation reactions (reactions between catalysts and catalyzable functional groups) may be selected from. See generally A. Martell et al. "Critical Stability Constants", Plenum Press, New York (1975) (tabulating complexation reactions), incorporated by reference herein.

In the case where the functionalized surface is photolithographically patterned prior to metallization, the metallization step, shown in step (5) of FIG. 1, will result in the deposition of a metal layer only on the unexposed portions of the surface. In many microelectronic applications, it is preferred to pattern the metal into electrical circuitry, and to use the surface layer as a circuit board. In the case where the surface is diamond, the diamond may act as an efficient heat sink for this circuitry. Preferably, the diamond layer will be on a substrate. For example, the diamond layer may be deposited by CVD. In other microelectronic applications, it will be preferred to use the diamond layer as a semiconductor.

In the case where the functionalized surface is not patterned prior to metallization, the metallization step will result in the deposition of a homogeneous metal layer on the entire surface.

The compatibility of the selective metallization process with oxidizable surfaces provides a considerable advantage in producing adherent metal coatings on surfaces for microelectronic and other applications. A number of these advantages (e.g., high resolution, additive process for metallization, controlled adhesion) are inherent in this process. Additional advantages are that fewer and less complex processing steps required for selective metallization, that adhesive metallization is obtained without high temperature annealing steps, and that substantially aqueous solutions of chemisorption precursors may be employed.

Having described the invention, the following examples are given to illustrate specific applications of the invention, including the best mode now known to perform the invention. These specific examples are not intended to limit the scope of the invention described in this application.

In the examples below, contact angle measurements were made with a water drop and an NRL Zisman-type contact angle goniometer.

In the examples below, "MES Buffer Solution" means a solution that was prepared as follows. 2.13 g MES.$H_2O$ solid was added to 50 ml $H_2O$ with stirring until dissolution. The pH of the solution was adjusted to between 4.9 and 5.0 by dropwise addition of dilute NaOH. The solution was diluted to 100 ml. This solution had an MES concentration of 0.1 M. Other concentrations of MES were obtained by appropriate adjustment of the dilution.

EXAMPLES

Example 1

Oxidation of Diamond Substrate Using $O_2$ Plasma Treatment

Substrates having a 10 μm thick CVD diamond film on a silicon wafer (Crystallume Co., Menlo Park, Calif.) were cleaned by sequential ultrasonication in toluene, 2-propanol, and deionized (DI) water. The water contact angle (measured using the sessile drop method) for the cleaned diamond surface was 68±4°, indicative of a relatively hydrophobic surface.

The diamond substrates were then inserted into a Branson Model IPC plasma etcher and subjected to an RF plasma using 1 torr and 225 sccm of $O_2$ for varying lengths of time and at different RF power levels. Oxidation conditions ranged from 30 sec at 25 Watts to 10 min at 100 W. All surfaces after plasma oxidation were highly wettable by water, and gave contact angles of 15±7°. No systematic dependence, or major variation of the contact angle was observed for the range of plasma oxidation conditions investigated.

X-ray photoelectron spectroscopy (XPS) of oxidized diamond under a variety of exposure conditions and times shows development of a feature on the CIS peak. The binding energy and intensity are consistent with a surface layer of oxygen bonded to the diamond surface. The contact angle and XPS measurements demonstrate that the $O_2$ plasma treatment is very effective at converting the initial diamond surface into a polar, highly wettable surface.

Example 2

Functionalization of an Oxidized Diamond Surface with 2-(trimethoxysilyl)ethyl-2-pyridine A plasma oxidized diamond film was prepared as described in Example 1, using an RF power of 100 W for 2 min. The oxidized diamond substrate was then immersed in a 1% (v/v) solution of 2-(trimethoxysilyl)ethyl-2-pyridine (Huls America, Piscataway, N.J.) in 0.001 M acetic acid/toluene at room temperature.

The solution was placed on a hotplate and warmed for 40 min. until the temperature reached 65° C. The diamond substrate was removed from the solution and rinsed twice in fresh toluene. The slide was then baked for 5 min. at 120° C. on the surface of a hotplate. The water contact angle of the silanized diamond surface was 45°, a value that is consistent with other substrates treated with this organosilane (see Dressick et al.). This example demonstrates that surface of a diamond substrate produced by $O_2$ plasma etching provides a sufficient density of the necessary functional groups for the attachment of an organosilane.

Example 3

Functionalization of an Oxidized Diamond Surface with (tridecafluoro-1,1,2,2-tetrahydrooctyl)-1-dimethyl-chlorosilane A plasma oxidized diamond film was prepared as described in Example 1. The substrate was then treated with a 1% (v/v) solution of (tridecafluoro-1,1,2,2-tetrahydrooctyl)-1-dimethylchlorosilane (Huls America) in toluene at room temperature under an argon atmosphere for 45 min.

The diamond substrate was removed from the solution, rinsed twice in fresh toluene, and was baked for 5 min. at 120° C. on the surface of a hotplate. The water contact angle of the silanized diamond surface ranged from 57–62°, a value that is similar to other substrates treated with this organosilane (see Dulcey et al. Science 252, 551 (1991)). XPS analysis of the modified surface shows signals for Si and F, both constituents of the organosilane layer that are not present on the unmodified diamond surface. This example demonstrates that surface of a diamond substrate produced by $O_2$ plasma etching provides the necessary functional groups for the attachment of chloro- as well as alkoxy-organosilane functional groups.

Example 4

Functionalization of an Oxidized Diamond Surface with m,p-(aminoethylaminomethyl) phenethyltrimethoxysilane A plasma oxidized diamond film was prepared as described in Example 1. The substrate was then treated with a 1% (v/v) solution of m,p-(aminoethylaminomethyl) phenethyltrimethoxysilane (Huls America) in 95:4 (v:v) methanol:water with 0.001 M acetic acid at room temperature for 25 min.

The diamond substrate was removed from the solution, rinsed twice in fresh toluene, and was baked for 5 min. at 120° C. on the surface of a hotplate. The water contact angle of the silanized diamond surface was 54±3°, a value that is similar to other substrates treated with this organosilane (see: Silicon Compounds Register and Review, Huls America). XPS analysis of the modified surface shows signals for Si and N, both constituents of the organosilane layer that are not present on the unmodified diamond surface. This example illustrates the generality of the procedure for modification of oxidized diamond surfaces with chemisorbed films.

Example 5

Functionalization of an Oxidized Silicon Carbide Surface with Adamantyltrichlorosilane A silicon carbide substrate (area≈1 $cm^2$) was oxidized in an RF oxygen plasma at 100 W for 30 sec. The water contact angle of the oxidized surface was 11°. The substrate was then treated with a 1% (v/v) solution of adamantyltrichlorosilane (Huls America) in toluene at room temperature for 5 min. The substrate was removed from the solution, rinsed twice in fresh toluene, and was baked for 5 min. at 120° C. on the surface of the hotplate. The water contact angle of the silanized surface was 69°, a value that is consistent with a surface having hydrophobic adamantyl groups. This example illustrates that substrates other than diamond can be functionalized by plasma oxidation followed by chemisorption of an organosilane film.

Example 6

Functionalization of an Oxidized Graphite Surface with Adamantyltrichlorosilane

A highly oriented pyrolytic graphite (HOPG) substrate (area≈1 $cm^2$) was oxidized in an RF oxygen plasma at 100

W for 30 sec. The water contact angle of the oxidized surface was 35°. The substrate was then treated with a 1% (v/v) solution of adamantyltrichlorosilane as described in Example 5. The water contact angle of the silanized surface was 69°, a value that is consistent with a hydrocarbon terminated surface. This example further illustrates the generality of the plasma oxidation/silanization process with regard to substrates other than diamond.

Example 7

Adhesive Metallization of a Functionalized Diamond Surface

A diamond film was treated with m,p-(aminoethylaminomethyl)phenethyltrimethoxysilane as described in Example 4. The film was then exposed to an aqueous palladium-based catalyst solution. The composition of this solution is as follows: $[Cl^-]=0.11$ M, [MES buffer]= 0.009 M, mg $Na_2PdCl_4 \cdot 3 H_2O/0.1$ l=10.3, pH=5.7. This was solution aged 2 days before use. The film was exposed to the solution for 35 min, rinsed with DI water, and then immersed in an electroless nickel plating bath (NIPOSIT™ 468, 10% strength; manufactured by Shipley Co., Newton, Mass.) at room temperature. Visible metal deposition initiated on the catalyzed surface within 2 min. and was allowed to continue for 1 hr after which a shiny white, nickel deposit was produced on the substrate. The metallized diamond film was removed from the plating bath, rinsed with DI water, and dried under a stream of filtered $N_2$. A Scotch™ tape peel test on the nickel plated surface resulted in no observable removal of metal from the substrate. This example demonstrates that the metallization process can be applied to diamond substrates to produce adhesive metal deposits without any high temperature annealing steps.

Example 8

Patterned Metallization of a Functionalized Diamond Surface

A diamond film was treated with 2-(trimethoxysilyl)ethyl-2-pyridine as described in Example 2. The diamond substrate was placed in mechanical contact with a chrome-on-quartz lithographic mask that had arrays of serpentine test structure with features to 10 μm linewidth. The film was then exposed through the mask to 10 $J/cm^2$ of 248 nm radiation from a KrF excimer laser. The exposed film was treated with the catalyst solution of Example 7 for 55 min, rinsed with DI water and immersed in an electroless cobalt plating bath for 4 min.

The electroless cobalt plating bath was prepared as follows: 6.0 g of $CoCl_2 \cdot 6 H_2O$, 10.0 g $NH_4Cl$ and 9.8 g $Na_2EDTA$ was dissolved in 150 ml of DI water and the pH brought to 8.2 by addition of 1M NaOH (aq) solution. Three volumes of the Co solution were added to one volume of a solution consisting of 8.0 g of dimethylamine borane complex in 100 ml of water.

The wafer was removed from the plating bath, rinsed with DI water and dried under a stream of filtered nitrogen. The wafer exhibited cobalt metal patterns with feature sizes to 10 μm in the unexposed regions of the surface, resulting in a positive tone image. This example demonstrates that diamond substrates can be rendered amenable to the UTF metallization process. It also demonstrates the generality of the process on diamond with respect to various electroless metallization baths.

Example 9

Patterned Metallization of a Functionalized Diamond Surface

A diamond film was treated with m,p-(aminoethylaminomethyl)phenethyltrimethoxysilane as described in Example 4. The diamond substrate was placed in mechanical contact with a lithographic mask. The film was then exposed through the mask to 1.2 $J/cm^2$ of 193 nm radiation from an ArF excimer laser. The exposed film was treated with the catalyst solution of Example 7 for 30 min, rinsed with DI water and immersed in the electroless nickel plating bath of Example 7 for 65 min. The wafer was removed from the plating bath, rinsed with DI water and dried under a stream of filtered nitrogen. The wafer exhibited nickel metal patterns in a positive tone image. This example demonstrates the generality of the metallization process on diamond substrates with regard to the film employed and the exposure wavelength.

Example 10

Adhesive Metallization of a Functionalized Acrylonitrile/Butadiene/Styrene (ABS) Plastic Surface A commercial grade piece of ABS plastic was oxidized with an RF plasma as described in Example 9. The oxidized plastic was then treated with a 1% solution of N-(2-aminoethyl)-3-aminopropyltrimethoxysilane (EDA) in water containing 0.001M acetic acid for 20 min. The substrate was then removed from the solution, rinsed with water and dried. The silanized ABS substrate was then catalyzed with the catalyst solution of Example 7 and then metallized with an electroless nickel bath as described in Example 7. A homogeneous nickel deposit was produced on the entire substrate. The metallized substrate was removed from the plating bath, rinsed with DI water, and dried. A tape peel test on the nickel plated surface resulted in no observable removal of metal from the substrate. This example demonstrates that the UTF metallization process can be applied to non-diamond substrates to produce adhesive metal deposits without any surface roughening or high temperature annealing steps. It further demonstrates that aqueous silane solutions can be used to functionalize oxidized substrates. Aqueous solutions allow substrates that are soluble in organics to be used in this process.

Example 11

Adhesive Metallization of a Functionalized Polycarbonate and Polysulfone Plastic Surfaces Commercial grade pieces of polycarbonate and polysulfone plastic were oxidized with an RF plasma, functionalized with EDA silane, and metallized with electroless nickel as described in Example 10. Homogeneous nickel deposits were produced across the entire surface of each substrate. A tape peel test on the nickel plated surface resulted in no observable removal of metal from the substrate. This example demonstrates the generality of the UTF metallization process for adhesive metallization of plastic substrates.

Example 12

Adhesive Metallization of a Functionalized Epoxy Polymer Surface

A spin cast film of an epoxy-based polymer (Shipley Multiposit™ XP91111 EC photodielectric) on a silicon wafer was oxidized with an RF plasma, functionalized with EDA silane, and metallized with EDA silane as described in Example 10. Homogeneous nickel deposits were produced across the entire surface of the epoxy substrate. A tape peel test on the nickel plated surfaces resulted in no observable removal of metal. This example demonstrates the generality of the UTF metallization process for adhesive metallization of polymer substrates.

Obviously, many modifications and variations of the present invention are possible in light of the above teachings. It is therefore to be understood that, within the scope of the appended claims, the invention may be practiced otherwise than as specifically described.

What is claimed is:

1. A process for selectively metallizing a diamond surface, comprising the steps of:

oxidizing a diamond surface in an oxygen containing plasma induced by radio frequency radiation having a power ranging from 25 to 200 Watts for a period of time ranging between 10 seconds and 20 minutes, said step of oxidizing producing on oxidized surface with a sufficient density of oxygen on said diamond surface to functionalize said diamond surface for chemisorption;

attaching to said oxidized surface a homogeneous layer of chemical functional groups by chemisorbing chemicals having both a polar surface moiety that bonds with said oxidized surface and moieties of a selected functionality which do not bond with said oxidized surface;

selectively catalyzing said functionalized surface with a catalyst for electroless plating; and selectively metallizing said catalyzed surface by electroless deposition, wherein the step of attaching chemical functional groups to said oxidized diamond surface is attaching said chemical containing an organosilane polar surface moiety that bonds to said oxidized diamond surface and containing an amine moiety which does not bond to said oxidized diamond surface, and wherein said chemical is monoamines, diamines, and triamines.

2. The process of claim 1, wherein said amine-containing functional groups are m,p-(aminoethylaminomethyl) phenethyltrimethoxysilane or 2-(trimethoxysilyl)ethyl-2-pyridine.

* * * * *